United States Patent [19]

Uken

[11] Patent Number: 4,865,905

[45] Date of Patent: Sep. 12, 1989

[54] ARTICLE FOR PROTECTION OF A SUBSTRATE

[75] Inventor: William D. Uken, Fremont, Calif.

[73] Assignee: Raychem Corporation, Menlo Park, Calif.

[21] Appl. No.: 283,020

[22] Filed: Dec. 9, 1988

Related U.S. Application Data

[63] Continuation of Ser. No. 165,452, Mar. 1, 1988, abandoned, which is a continuation of Ser. No. 54,138, May 12, 1987, abandoned, which is a continuation of Ser. No. 894,755, Aug. 13, 1986, abandoned, which is a continuation of Ser. No. 725,507, Apr. 22, 1985, abandoned, which is a continuation of Ser. No. 507,435, Jun. 23, 1983, abandoned.

[51] Int. Cl.$^4$ .............. B32B 1/04; B32B 3/02; H01B 13/00; H02G 13/02

[52] U.S. Cl. .................. 428/220; 156/48; 156/49; 174/76; 174/84 R; 428/268; 428/269; 428/304.4; 428/307.3; 428/308.4; 428/309.9; 428/320.2; 428/322.7; 428/447

[58] Field of Search .............. 156/48, 49; 174/76, 174/84 R; 428/220, 268, 269, 304.4, 307.3, 308.4, 309.9, 320.2, 322.7, 447

[56] References Cited

U.S. PATENT DOCUMENTS

| | | | |
|---|---|---|---|
| Re. 30,321 | 7/1980 | Brauer et al. | 528/361 |
| Re. 31,389 | 9/1983 | Brauer et al. | 210/321.3 |
| 2,763,609 | 9/1956 | Lewis et al. | 284/154 |
| 3,020,260 | 2/1962 | Nelson | 528/15 |
| 3,187,088 | 6/1965 | Warner | 174/91 |
| 3,228,820 | 1/1966 | Samson | 428/247 |
| 3,249,581 | 5/1966 | Nelson | 524/861 |
| 3,308,450 | 3/1967 | Spence | 5/450 |
| 3,427,393 | 2/1969 | Masterson | 174/23 C |
| 3,548,420 | 12/1970 | Spence | 528/15 |
| 3,619,481 | 11/1971 | Smith | 174/138 F |
| 3,624,022 | 11/1971 | Ross | 523/219 |
| 3,649,436 | 3/1972 | Buese | 428/317.3 |
| 3,669,796 | 6/1972 | Hall et al. | 156/272 |
| 3,678,174 | 7/1972 | Ganzhorn | 174/84 R |
| 3,718,619 | 2/1973 | Rustad | 528/63 |
| 3,731,258 | 5/1973 | Spicer | 339/48 |
| 3,801,532 | 4/1974 | Olstowski | 524/792 |
| 3,865,788 | 2/1975 | Gaylord | 525/474 |
| 3,879,575 | 4/1975 | Dobbin et al. | 174/92 |
| 3,897,129 | 7/1975 | Farrar, Jr. | 339/116 C |
| 3,916,082 | 10/1975 | Gillemot | 174/41 |
| 3,928,704 | 12/1975 | Heidingsfeld et al. | 428/904 |
| 3,929,949 | 12/1975 | Day et al. | 428/904 |
| 3,985,951 | 10/1976 | Harris | 174/138 F |
| 3,992,569 | 11/1976 | Hankins et al. | 174/92 |
| 3,998,215 | 12/1976 | Anderson | 128/641 |
| 4,025,717 | 5/1977 | Whittingham | 174/88 C |
| 4,026,747 | 5/1977 | De Lorean et al. | 428/322.7 |
| 4,064,027 | 12/1977 | Gant | 204/159.13 |
| 4,102,716 | 7/1978 | Groves et al. | 156/48 |
| 4,151,057 | 4/1979 | St. Clair et al. | 204/159.17 |

(List continued on next page.)

FOREIGN PATENT DOCUMENTS 2070658  9/1981  United Kingdom ............... 428/904

Primary Examiner—William J. Van Balen
Attorney, Agent, or Firm—Burns, Doane, Swecker & Mathis

[57] ABSTRACT

An article that may be employed to protect a substrate by wrapping the article around the substrate. The article comprises a flexible matrix which is composed of a first material and comprises a plurality of open interstices, the interstices having an average volume of less than 0.01 inch$^3$; and an impregnant which is composed of a second material which has a cone penetration value of 100 to 350 ($10^{-1}$ mm) and an ultimate elongation of at least 200%, and comprises a plurality of interconnected segments which lie within the interstices of the matrix. The matrix and the impregnant are such that, when the article is stretched, the matrix reaches its ultimate elongation before the impregnant reaches its ultimate elongation.

17 Claims, 1 Drawing Sheet

U.S. PATENT DOCUMENTS

| | | | |
|---|---|---|---|
| 4,163,081 | 7/1979 | Schulz | 428/429 |
| 4,163,082 | 7/1979 | Romenesko | 428/447 |
| 4,168,258 | 9/1979 | Brauer et al. | 524/140 |
| 4,171,998 | 10/1979 | Brauer et al. | 156/48 |
| 4,176,239 | 11/1979 | Brauer et al. | 174/23 C |
| 4,176,240 | 11/1979 | Sabia | 174/23 C |
| 4,196,273 | 4/1980 | Imai et al. | 528/15 |
| 4,219,598 | 8/1980 | Noma et al. | 428/260 |
| 4,231,986 | 11/1980 | Brauer et al. | 264/272 |
| 4,272,514 | 6/1981 | Spence | 424/69 |
| 4,280,263 | 7/1981 | Dean et al. | 29/132 |
| 4,281,210 | 7/1981 | Brauer et al. | 174/23 C |
| 4,297,155 | 10/1981 | Jervis | 156/86 |
| 4,315,703 | 2/1982 | Gasper | 405/264 |
| 4,327,147 | 4/1982 | Ou-Yang | 156/69 |
| 4,329,442 | 5/1982 | Pokorny | 528/49 |
| 4,364,809 | 12/1982 | Sato et al. | 204/159.13 |
| 4,369,284 | 1/1983 | Chen | 524/476 |
| 4,375,521 | 3/1983 | Arnold | 523/173 |
| 4,380,569 | 4/1983 | Shaw | 428/283 |
| 4,426,476 | 1/1984 | Chang | 524/288 |
| 4,444,822 | 4/1984 | Doyle et al. | 428/109 |
| 4,451,696 | 5/1984 | Beinhaur | 174/92 |
| 4,466,843 | 8/1984 | Shimirak | 428/304.4 |
| 4,504,699 | 3/1985 | Dones | 174/84 R |
| 4,552,183 | 11/1985 | Chick | 138/99 |
| 4,600,261 | 7/1986 | Debbaut | 339/116 C |
| 4,634,207 | 1/1987 | Debbaut | 339/116 C |

FIG_1A                FIG_1B
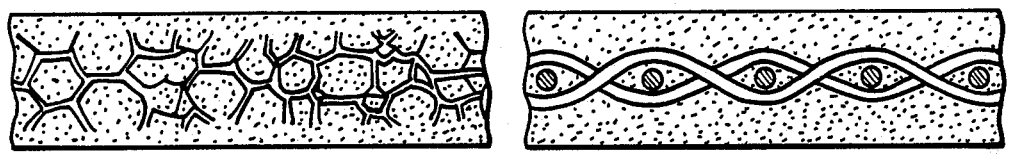
FIG_2A                FIG_2B
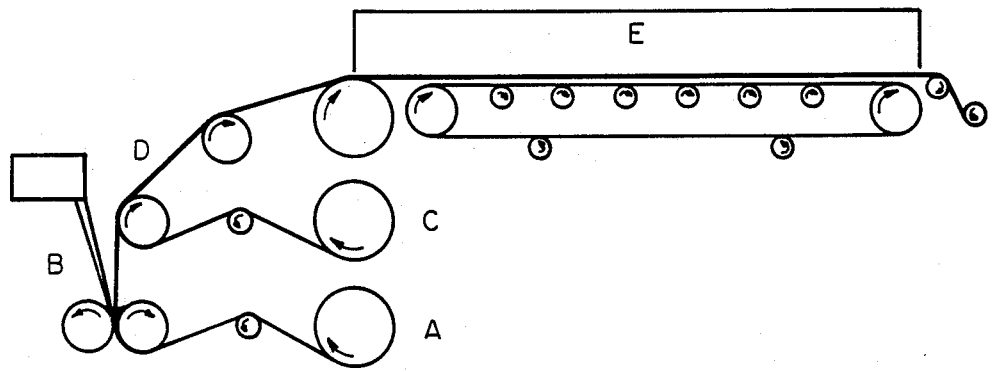
FIG_3

ARTICLE FOR PROTECTION OF A SUBSTRATE

This applicaton is a continuation of application Ser. No. 07/165,452, filed Mar. 1, 1988, now abandoned, which is a continuation of application Ser. No. 07/054,138, filed May 12, 1987, abandoned which is a continuation of application Ser. No. 894,755, filed 8/13/86, a continuation of 725,507 filed 4/22/85, which is a continuation of 507,435 filed 6/23/83, all abandoned.

TECHNICAL FIELD

The present invention relates to an article that may be provided to protect a substrate, and to a method that uses the article to protect the substrate.

BACKGROUND ART

Articles (and/or compositions) are known that may be used as a sealant and void-filler to protect a substrate in a corrosive, moist and adverse environment. These articles and/or compositions include simple tape wrappings as well as heat-recoverable materials (see Cook et al U.S. Pat. No. 3,086,242). Other articles and/or compositions that are advantageously employed under appropriate conditions are oils, greases and adhesives.

A further important candidate for a sealant and void filler composition is an encapsulant e.g. a gel. Heretofore, gels have typically been prepared as a two-part liquid composition with ingredients that react slowly together. Before the ingredients have gelled the liquid composition is poured into a container that holds a substrate to be sealed; the liquid composition subsequently cures in situ to form a gel (see U.S. Pat. No. 4,375,521 and U.S. Pat. No. 4,102,716). This procedure is not optimal, however, since it involves preparation of the liquid composition at the site, and delay while the composition gels. Additionally, it is not always practical to deliver the gel to the substrate by way of the container. Furthermore, when reentry to the sealed substrate is required, the gelled composition cannot easily be removed.

Copending application Ser. No. 434,011 filed Oct. 12, 1982, by Christian A. Debbaut now U.S. Pat. 4,600,261, and the Continuation in part thereof, Ser. No. 504,000 filed 13 June, 1983, now U.S. Pat. No. 4,634,207, describe apparatus for providing a protective covering over a substrate, the apparatus comprising a support member and an encapsulant which adheres to the support member and has a cone penetration value of 100 to 350 ($10^{-1}$ mm) and an ultimate elongation of at least 200%. Preferred encapsulants are gels formed by curing of suitable precursors, e.g. of polyurethanes or polysiloxanes, in the presence of suitable reactive or non-reactive extenders and plasticizers. The disclosures of these two applications are incorporated herein by reference.

SUMMARY OF THE INVENTION

I have now discovered a particularly advantageous way of delivering encapsulants as disclosed in the two Debbaut applications to a substrate to be protected. According to my invention, the encapsulant is supported by and distributed in an open-cell polymeric foam or a like matrix having a plurality of small interstices, thus providing a flexible and preferably extensible article which can be wrapped around a substrate to provide a thin, conforming and continuous moisture protective coating over the substrate.

In one aspect, the present invention provides an article which comprises a flexible matrix which is composed of a first material and comprises an plurality of open interstices, the interstices having an average volume of less than 0.01 inch$^3$; and an impregnant which is composed of a second material which has a cone penetration value of 100 to 350 ($10^{-1}$ mm) and an ultimate elongation of at least 200%, and comprises a plurality of interconnected segments which lie within the interstices of the matrix. The matrix and the impregnant are such that, when the article is stretched, the matrix reaches its ultimate elongation before the impregnant reaches its ultimate elongation.

In another aspect, the present invention includes a method of providing a protective coating on a substrate which comprises wrapping around the substrate, e.g. in overlapping spiral wraps, an article which is in the form of a sheet and which comprises a flexible matrix which is composed of a first material and comprises a plurality of open interstices, the interstices having an average volume of less than 0.01 inch$^3$; and an impregnant which is composed of a second material which has a cone penetration value of 100 to 350 ($10^{-1}$ mm) and an ultimate elongation of at least 200%, and comprises a plurality of interconnected segments which lie within the interstices of the matrix; any stretching which the article undergoes while it is being wrapped being less than the ultimate elongation of the matrix and less than the ultimate elongation of the impregnant.

The articles of the present invention can be prepared by (1) impregnating the matrix with a curable liquid composition which, when cured, will have the desired cone penetration and elongation values, and (2) curing the liquid composition.

BRIEF DESCRIPTION OF THE DRAWINGS

The invention is illustrated in the accompanying drawings in which:

FIGS. 1a & 1b illustrate the employment of the present invention as a sealant and void-filler;

FIGS. 2a & 2b provide cross-sectional views of alternative embodiments of the article of the present invention; and FIG. 3 is a diagrammatic illustration of one process for making the article of FIG. 1a.

DETAILED DESCRIPTION OF THE INVENTION

The article of the present invention comprises a flexible matrix and an impregnant. In a preferred embodiment of the present invention, the impregnant is a gel that has an ultimate elongation of at least 200%, preferably at least 500%, and a cone penetration value of 100 to 350, preferably 200 to 350, ($10^{-1}$ mm). Elongation values given in this specification are ultimate elongations measured by ASTM D638-80 at 70° F. 5° F., using a Type 4 die to cut the sample and at a speed of 50 cm/minute. Cone penetration values given in this specification are expressed in units of $10^{-1}$ mm and are measured by ASTM D217-68 at 70° F. 5° F., on an undisturbed sample using a standard 1:1 scale cone (cone weight 102.5g, shaft weight 47.5g), the penetration being measured after 5 seconds.

In accordance with the principles of the present invention, gels can be provided with different cone penetration values e.g. 100, 200, 300, 350. The different cone penetration values for the gel are a consequence of variations in the composition of the gel, as explained in more detail below.

One selects a particular cone penetration value in accordance with a desired or expected employment of the present invention as a sealant and void filler. In this regard, cone penetration values that are higher correspond to gels which are relatively softer, tackier and have a greater elongation than gels having a relatively lower cone penetration value. Consequently, if one, for example, expects to employ the present invention as a sealant and void filler for a punctured cable, as shown in FIG. 1a, it is preferable to select a gel having a relatively low cone penetration value, say 250 ($10^{-1}$ mm). If, on the other hand, one expects to employ the invention to seal and void fill (by wrapping around) a complex form such as a cable union, as shown in FIG. 1b, it is preferable to select a gel having a relatively large cone penetration value, say 300 ($10^{-1}$ mm). In all cases, as noted above, the cone penetration value ranges from 100 to 350 ($10^{-1}$ mm).

Any particular composition of the gel has both a cone penetration value and an associated ultimate elongation; e.g. a gel having a cone penetration value of 250 is observed to have an ultimate elongation of 400%. In accordance with the principles of the present invention, the flexible matrix and the impregnant, i.e. the gel, are such that when the article is stretched, the flexible matrix reaches its ultimate elongation before the impregnant reaches its ultimate elongation.

As indicated above, the articles of the present invention include a flexible matrix which comprises a plurality of open interstices having an average volume of less than 0.01 inch$^3$, preferably less than 0.001 inch$^3$. In a preferred embodiment, as shown for example in FIG. 2a, the flexible matrix comprises a first material that is an organic polymer, in particular an open cell foam having an average cell size of 5 to 30 mils, preferably 10 to 20 mils.

In an alternative embodiment of the present invention, as shown for example in FIG. 2b, the matrix is a woven or nonwoven fabric, the fibers of the fabric being natural or synthetic and composed of organic or inorganic material, e.g. glass fibers, metal fibers and organic polymer fibers. More particularly, the fabric may be a woven fabric that is 5 to 60 mils thick. When the matrix comprises metal fibers, the article may be useful, for example, in providing electrical shielding over a substrate.

As also indicated above, the flexible matrix is impregnated with a gel that has an ultimate elongation of at least 200% preferably 500%, and a cone penetration value of 100 to 350 ($10^{-1}$ mm), especially 200 to 350 ($10^{-1}$ mm). A gel having these characteristics can be prepared by gelling curable polyurethane precursor materials in the presence of substantial quantities of a mineral oil, a vegetable oil or a plasticizer, or a mixture of two or more of these. Excellent results may be obtained using gels prepared by gelling components which are commercially available for the preparation of polyurethane gels in situ, the gelation being carried out, however, in the presence of a suitable amount e.g. 30 to 70% by weight, of a suitable plasticizer, e.g. a trimellitate, or in the presence of a suitable animal or vegetable oil, e.g. 80 to 60%, preferably 80 to 70%, by weight of a mixture of mineral and vegetable oils in which the ratio by weight of mineral oil to vegetable oil is 0.7 to 2.4.

Other suitable gels can be prepared by curing reactive silicones with non-reactive extender silicones. In addition, the gel may include known additives such as moisture scavengers (e.g. benzoylchloride), antioxidants, fillers, pigments and fungicides etc. Other specific compositions for the gel are conceivable and may be employed within the scope of the present invention.

The gel is preferably electrically insulating (volume resistivity of at least approximately $10^9$ ohms centimeter), tacky, hydrolytically stable, moisture insensitive, and substantially inert towards the substrate which is to be protected. Any exposed surface(s) of the gel can be covered by a release sheet which is removed before the article is used.

The gel impregnates the flexible matrix so that it mechanically bonds to the matrix. In this regard, it is recalled that the gel comprises a plurality of interconnected segments which lie within the interstices of the matrix. The interconnections may be through openings in shared walls of adjacent interstices (as for example in open-celled foams) and/or through a surface layer of impregnant which connects segments of impregnant which lie in adjacent interstices which may not communicate with each other (as for example in a woven fabric).

Preparation of the articles of the invention may be effected for example by way of a process as shown in FIG. 3. Here, the matrix is a roll of polyurethane foam, typically 10 to 50 mils thick, preferably 15 to 30 mils thick (location A). The roll is fed to a liquid gel bath at a location B, so that gel precursors of the type disclosed above may impregnate the foam. A release member (location C) is subsequently applied to the roll at a location D. The impregnated matrix is passed through a heating conveyor (at a location E) in order to cure the gel precursors. Note that other suitable processes can also be employed to impregnate the open matrix.

The articles of the present invention are preferably in the form of sheets or tapes which can be wrapped around the substrate to be protected. The thickness of such tapes or sheets is preferably 10 to 300 mils, particularly 15 to 80 mils, and their ultimate elongation is preferably at least 50%, particularly at least 100%. For satisfactory adhesion to the substrate, preferably at least the interior surface of the tape or sheet consists essentially of the impregnant. Additionally, the ratio by volume of the impregnant to the matrix is preferably at least 7.0, especially at least 9.0, particularly at least 9.5.

The method of the present invention is advantageously employed to protect substrates having discontinuous or non-uniform configurations. In particular, the article may be wrapped-around substrates e.g. couplings to cables, without a need to use additional fastening means, hardware or heat. Further, the article as applied can be "re-entered" i.e. unwrapped or cut and cleanly peeled away from the substrate.

The invention is illustrated by the following Example.

EXAMPLE

A commercially available polymeric foam sheet material ("Pro Wrap") was used as the matrix for preparation of an article of the invention. The foam material had a thickness of 15–20 mils, an average cell size of 5–10 mils (i.e. it was 2–3 cells thick), about 96% by volume of voids, and a density of about 0.044g/cc. It is believed to be a polyurethane material. A strip of the foam was placed on a surface having a release coating thereon, and was then knife-coated with a composition comprising a mixture of a commercially available polyurethane precursor ("Gella" available from Minnesota Mining and Manufacturing Co.) and about 50-55% by weight of a plasticizer for the polyurethane (n-octyl-n-decyl trimellitate). Samples were cured in an oven at 100° C. The resulting products were 40-50 mils thick. When one of the products was wrapped around a cable TV connector in an overlapping spiral, it stretched easily to accommodate the irregularities of the connector and formed an excellent sealed protective covering over the connector.

The present invention, in summary, may be employed as a sealant and void-filler to protect a substrate in an adverse environment. Although specific embodiments of the present invention have been described herein, it will be obvious to those skilled in the art that various modifications may be made without departing from the spirit of the invention. With the foregoing in mind, it is understood that the invention be awarded the full scope of the appended claims.

I claim:

1. An article for protecting a substrate from moisture, comprising:
    (1) a flexible, extensible matrix which
        (a) is composed of a first material and
        (b) comprises a plurality of open interstices, the interstices having an average volume of less than 0.01 inch$^3$, and
    (2) a moisture-insensitive impregnant which
        (a) is composed of a second material which when cured has a cone penetration value of 100 to 350 ($10^{-1}$ mm) and an ultimate elongation of at least 200%, and
        (b) comprises a plurality of interconnected segments which lie within the interstices of the matrix, the impregnant being cured prior to coming into contact with any part of the substrate to be protected;

the matrix and the impregnant being such that, when the article is stretched, the matrix reaches its ultimate elongation before the impregnant reaches its ultimate elongation so as to provide a continuous moisture protection coating over the substrate.

2. An article according to claim 1, wherein the first material comprises an organic polymer.

3. An article according to claim 2, wherein the matrix is an open cell foam.

4. An article according to claim 3, wherein the average cell size is 5 to 30 mils.

5. An article according to claim 4, wherein the average cell size is 10 to 20 mils.

6. An article according to claim 3, wherein the matrix is in the form of a tape which is 10 to 300 mils thick.

7. An article according to claim 6, wherein the tape is 15 to 80 mils thick.

8. An article according to claim 1, wherein the matrix is a fabric.

9. An article according to claim 8, wherein the matrix comprises metal fibers.

10. An article according to claim 8, wherein the fabric is a woven fabric and is 5 to 60 mils thick.

11. An article according to claim 1 which is in the form of a tape.

12. An article according to claim 11 which is 10 to 300 mils thick and whose principal surfaces consist essentially of the impregnant.

13. An article according to claim 1, wherein the ratio by volume of the impregnant to the matrix is at least 7.0.

14. An article according to claim 1, wherein the ratio is at least 9.0.

15. An article according to claim 1, wherein the ratio is at least 9.5.

16. An article according to claim 1, wherein the second material has a cone penetration value of 200 to 350.

17. An article according to claim 1, wherein the second material has an ultimate elongation of at least 500%.

* * * * *